(12) United States Patent
Lu et al.

(10) Patent No.: US 6,592,325 B2
(45) Date of Patent: Jul. 15, 2003

(54) AIR-SUSPENDED DIE SORTER

(75) Inventors: Weng-Jung Lu, Hsinchu (TW);
Chin-Yuan Liu, Hsinchu (TW);
Shyan-Haur Jane, Hsinchu (TW);
Chun-Kuei Lai, Hsinchu (TW);
Chao-Hsien Huang, Taipei (TW);
Chih-Min Lin, MiaoLi (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/887,426

(22) Filed: Jun. 25, 2001

(65) Prior Publication Data

US 2003/0015459 A1 Jan. 23, 2003

(51) Int. Cl.⁷ .............................. B65G 1/133; B66C 1/02
(52) U.S. Cl. ..................... 414/752.1; 74/627; 414/737; 414/225.01
(58) Field of Search .................. 901/40, 46; 74/490.01; 414/627, 935, 941, 752.1, 737, 146, 222.01, 225.01, 226.05, 437, 618, 749.1; 209/643, 591; 294/641

(56) References Cited

U.S. PATENT DOCUMENTS

| | | | | |
|---|---|---|---|---|
| 3,973,682 A | * | 8/1976 | Neff | 414/627 |
| 4,078,671 A | * | 3/1978 | Lundstrom | 294/64.1 |
| 4,266,905 A | * | 5/1981 | Birk et al. | 414/627 |
| 4,451,197 A | * | 5/1984 | Lange | 414/737 |
| 4,611,846 A | * | 9/1986 | Feiber et al. | 269/156 |
| 4,657,470 A | * | 4/1987 | Clarke et al. | 414/627 |
| 4,749,329 A | * | 6/1988 | Stout | 414/627 |
| 4,858,975 A | * | 8/1989 | Ogawa | 294/64.1 |
| 5,308,132 A | * | 5/1994 | Kirby et al. | 294/64.1 |
| 5,385,441 A | * | 1/1995 | Swapp et al. | 414/627 |
| 6,145,901 A | * | 11/2000 | Rich | 294/64.1 |
| 6,178,621 B1 | * | 1/2001 | Shida et al. | 29/721 |
| 6,328,362 B1 | * | 12/2001 | Isogai et al. | 294/64.1 |
| 2001/0049874 A1 | * | 12/2001 | Okuda et al. | 29/740 |
| 2002/0060464 A1 | * | 1/2002 | Bendat et al. | 294/64.1 |

FOREIGN PATENT DOCUMENTS

| | | | | |
|---|---|---|---|---|
| DE | 3902663 A1 | * | 8/1990 | B66F/3/36 |
| EP | 0129732 A1 | * | 1/1985 | H05K/13/00 |
| JP | 59-181634 A | * | 10/1984 | H01L/21/68 |
| JP | 61-131847 A | * | 6/1986 | B23Q/7/04 |
| JP | 1-96935 A | * | 4/1989 | H01L/21/52 |
| JP | 4-30983 A | * | 2/1992 | B25J/15/06 |

* cited by examiner

Primary Examiner—Donald P. Walsh
Assistant Examiner—Mark J Beauchaine
(74) Attorney, Agent, or Firm—Troxell Law Office PLLC

(57) ABSTRACT

An air-suspended die sorter is disclosed, in particular an air-suspended die sorter capable of performing die sorting, die attaching and die pick-up in the semiconductor industry. The present invention provides an air-suspended die sorter capable of eliminating spring preload, and lowering mechanical friction so as to lift die sorting precision and elevate the success rate, and has a cylinder unit, a piston unit and a pressure unit. The piston type design and a precise control of pressure on top and on bottom of the piston, respectively, enables the present invention to offer an air-suspended state that has done away with stress problems associated with the use of springs. The present invention further provides a novel buffer design for reducing friction and die impact often encountered in prior art applications.

26 Claims, 7 Drawing Sheets

AIR-SUSPENDED DIE SORTER

FIELD OF THE INVENTION

The present invention relates to an air-suspended die sorter and in particular relates to an air-suspended die sorter capable of performing die sorting, die attach and die pick-up in the semiconductor industry.

BACKGROUND OF THE INVENTION

After semiconductor wafers are divided into dies, die sorters are used in manufacturing operations to pick up and place dies on die trays. The same procedure that repeats a number of times in subsequent die testing, die attach and packaging is accomplished by using die sorters.

Today's die sorters normally attach a sorter tip to a robot arm. Having an air passage going cross its center and being connected to a vacuum pump that provides a vacuum condition, sorter tip picks up a die via suction when it approaches and reaches the die. When the robot arm carries the sorter tip to a designated location and as a proper amount of air is allowed into air passage, the die lands on the designated location since the vacuum condition no longer exists.

Since the sorter tip as described above utilizes spring type parts for providing buffer mechanism that absorbs impact energy, prior art sorter tip possesses the following deficiencies:

(1) Spring preload: Before being used as a buffer mechanism, a spring has to be preloaded with an initial compression setting, which inevitably reduces spring's impact absorbing capacity. This reduction of capacity causes damage to the die if and when the sorter tip fails to provide adequate impact absorbance.

(2) Mechanical friction: A spring has to overcome mechanical friction when being used to provide a buffer mechanism. This further reduces spring's impact absorbing capacity.

(3) Difficulties in picking up the die: When the spring type sorter tip fails to provide adequate impact absorbance, small dies (less than 0.5 cm$^2$, for example) often get flipped over or get damaged by a spring type sorter.

(4) Imprecise control: Prior art spring type sorter tip is incapable of controlling the amount of air that is allowed in to break the vacuum condition. This lack of precision control often causes the die to land too fast such that the die flips over, stands up on its side or lands outside die tray. Sometimes, the die fails to land at all.

SUMMARY OF THE INVENTION

Aimed at resolving the above disadvantages, the main object of the present invention is to provide an air-suspended die sorter capable of eliminating spring preload, lowering mechanical friction so as to lift die sorting precision and elevate success rate.

Another object of the present invention is to provide an air-suspended die sorter capable of controlling and providing the precise amount of air by solenoid valves and pneumatic regulators to terminate the vacuum state, thus raising the success rate for landing the die.

In order to attain the above goals, an air-suspended die sorter 10 in accordance with the first preferred embodiment of the present invention comprises a cylinder unit, a piston unit and a pressure unit. The cylinder unit includes at least a trunk and a lower cap. The trunk has a through hole going through it and said through hole has a first end and a second end. Located on the side of the second end of the trunk, the lower cap and the trunk form a hollow space therein between. A first fitting and a second fitting are provided on the trunk such that the first fitting is connected with the first end of the through hole and the second fitting is connected with the hollow space. The piston unit includes at least one shank holder shaft. The shank holder shaft comprises a piston portion, an air-suspended portion, an extension portion and an air passage going through the piston portion, the air-suspended portion and the extension portion. The piston portion is capable of fitting in the through hole and moving along the axis. A first air chamber is formed between the air-suspended portion, which is provided in the hollow space, and the trunk. The extension portion extends outside the lower cap through a gap provided between the lower cap and the extension portion. The pressure unit includes at least a vacuum device, a pressure source and a first pneumatic regulator. Being connected with the first fitting, the vacuum device is capable of providing a low-pressure state at the first end of the through hole and the air passage for enabling the pick-up operation. Being connected between the second fitting and the pressure source, the first pneumatic regulator is capable of controlling the pressure in the sealed first chamber and balancing the pressure on the top and on the bottom of the air-suspended portion, thereby providing the air-suspended state for the shank holder shaft.

The pressure unit further includes a first solenoid valve, a second solenoid valve and a second pneumatic regulator. The first solenoid valve is connected between the vacuum device and the first fitting. One end of the second solenoid valve is connected with the first solenoid. The second pneumatic regulator is connected between the second solenoid valve and the pressure source. By properly controlling the first solenoid valve and the second solenoid valve to switch between having air flow and otherwise, the pressure source provides a certain amount of air between the first solenoid valve and the second solenoid valve. The first solenoid valve allows the first fitting to be in air contact with the vacuum device and the second solenoid valve, alternatively. When the first fitting is in air contact with the vacuum device, the air passage that goes through the pick-up tip, the pick-up head and the piston, respectively, is in a low-pressure state (or vacuum state) for allowing a die to be picked up. When the first fitting is having air contact with the second solenoid valve, said certain amount of air between the first solenoid valve and the second solenoid valve is permitted to enter the air passage and terminate the vacuum condition, thereby allowing a die to be released.

Thank to a piston type design and a precise control of pressure on the top and on the bottom of the piston, respectively, the present invention offers an air-suspended state that has done away with stress problems associated with using springs. The present invention further provides a novel buffer design for reducing friction and die impact often encountered in prior art applications. Precise amount of air is sealed between the solenoid valves by serially connecting the piston type die sorter with two solenoid valves and a pneumatic regulator. Moreover, termination of vacuum state is accomplished by allowing the precise amount of air sealed between the two solenoid valves to enter the air-suspended die sorter.

The following Description and Designation of Drawings are provided in order to help understand the features and content of the present invention.

The accompanying drawings form a material part of this description, in which.

DETAILED DESCRIPTION OF THE PREFERRED EMBODIMENT

In the following description, the present invention is described in connection with a specific and preferred embodiment. It will be understood that the present invention is not limited to these embodiments, but rather is to be construed as the spirit and scope defined by the appended claims.

In the present specification, the structure and process are described as comprising specific components and steps, respectively. It is within the contemplation of the present inventors that the structure and process can consist essentially of, or consist of, the disclosed components and steps, respectively.

One of the main features of the present invention is having a piston type sorter tip and applying on it a precisely controlled air pressure for creating an air suspension condition. Taking advantages of precise air pressure, the present invention minimizes spring preload problems. Specifically, by reducing mechanical friction and increasing buffer capability, the application of air suspension has dispensed with problems encountered by spring type sorter tip, particularly when being used for picking up or releasing small dies. By opening one of the two solenoid valves, a precise amount of air being sealed in pipelines between two solenoid valves is allowed to enter the sorter tip to reverse the vacuum condition, precisely. A preferred embodiment is illustrated as follows.

Figure 1:
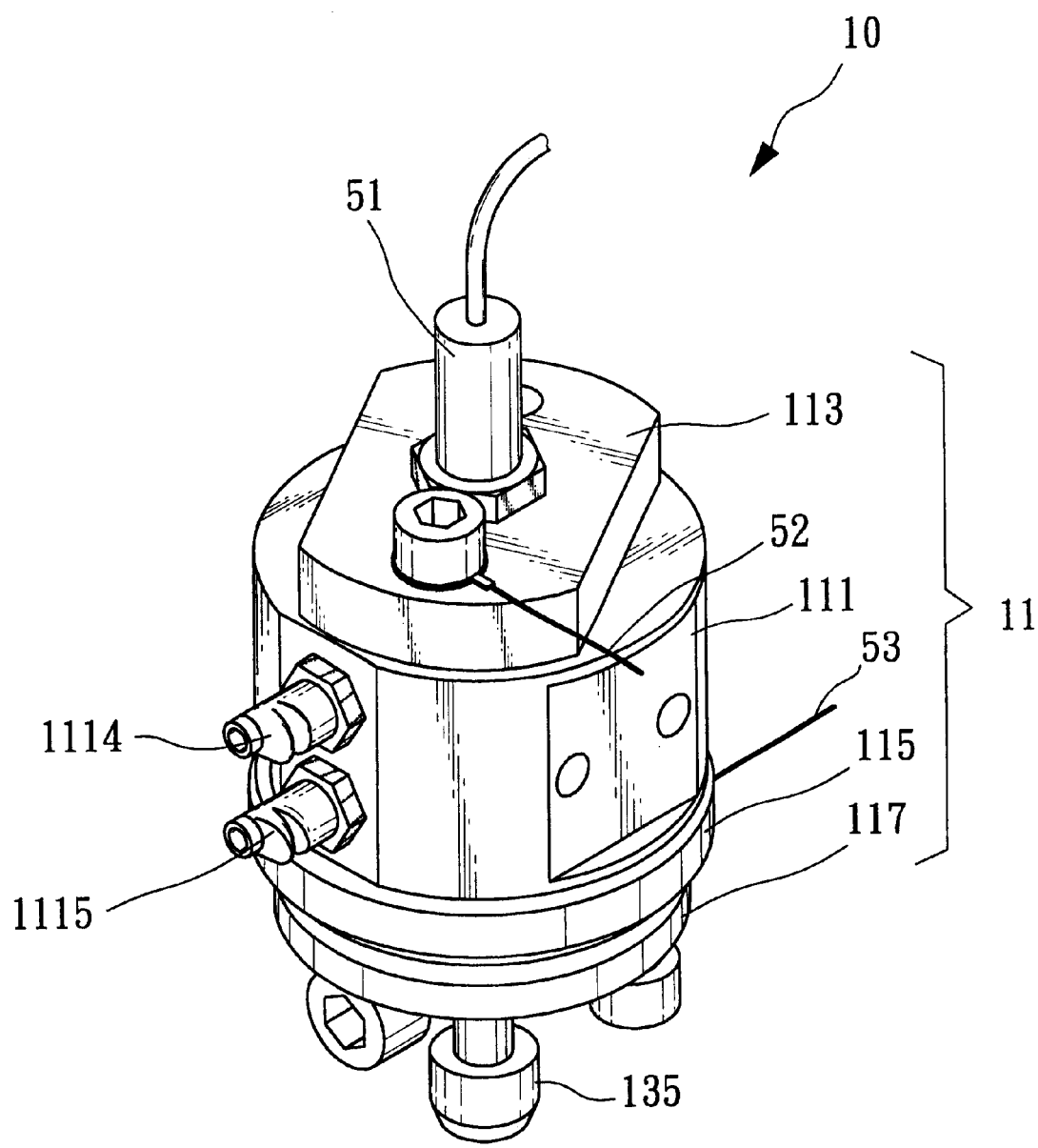
FIG. 1 is a three-dimensional view of an air-suspended die sorter in accordance with the first preferred embodiment of the present invention.
Figure 2:
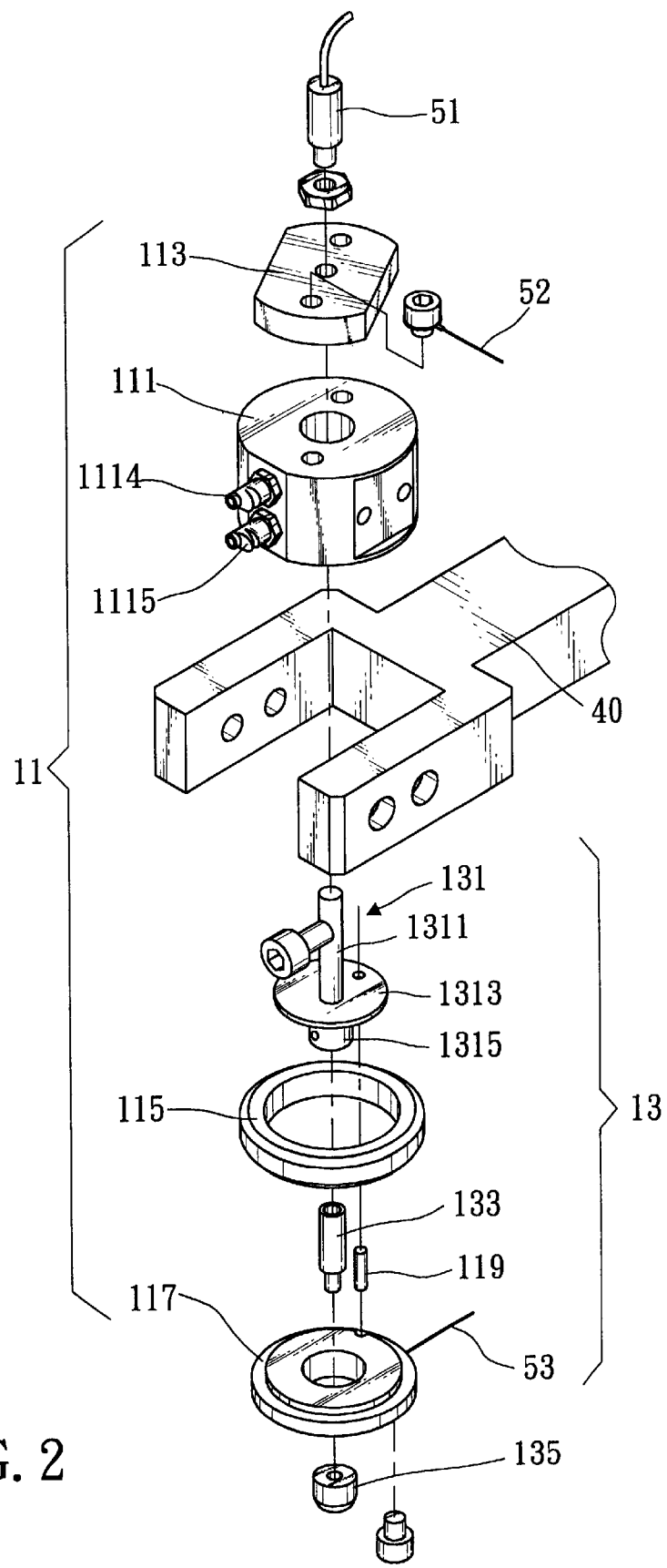
FIG. 2 is an explosive view of an air-suspended die sorter in accordance with the first preferred embodiment of the present invention.
Figure 3:
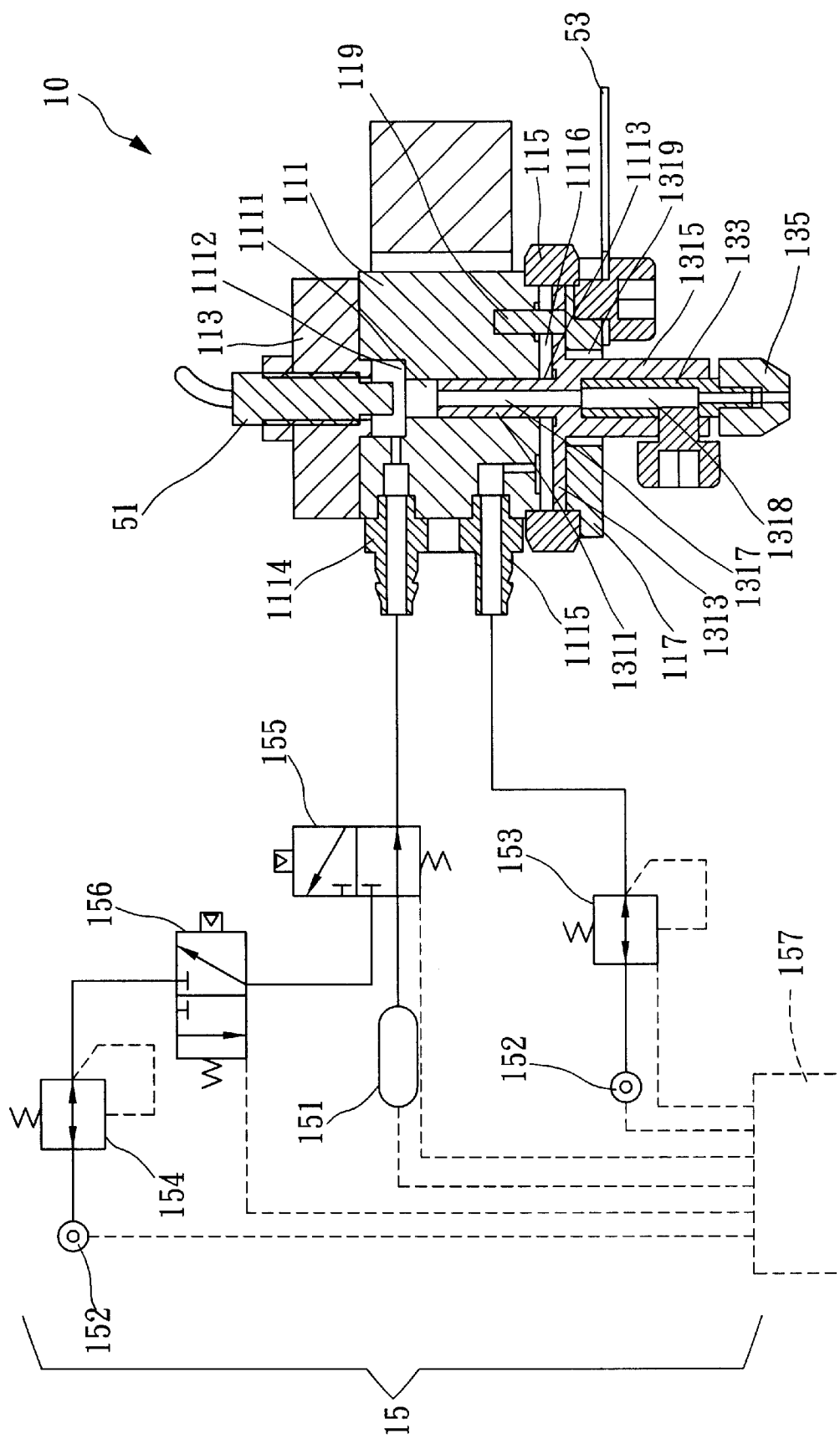
FIG. 3 is a cross-sectional view of an air-suspended die sorter in accordance with the first preferred embodiment of the present invention.

Please refer to FIG. 2 and FIG. 3, which are an explosive view and a cross-sectional view of an air-suspended die sorter 10 in accordance with the first preferred embodiment of the present invention, respectively. The air-suspended die sorter 10 according to this preferred embodiment comprises a cylinder unit 11, a piston unit 13 and a pressure unit 15.

As shown in FIG. 2 and FIG. 3, the cylinder unit 11 has at least a trunk 111, an upper cap 113, a hollow ring 115 and a lower cap 117. A through hole 1111 is provided on the trunk 111 and a first end 1112 and a second end 1113 are provided at both ends of the through hole 1111, respectively. The lower cap 117 is provided on the side of the second end 1113 and the hollow ring 115 is disposed in a space (no numeral) between the lower cap 117 and the trunk 111. On the trunk 111, a first fitting 1114 and a second fitting 1115 are provided to connect with the first end 1112 of the through hole 1111 and the side of said space adjacent to the trunk 111, respectively. The upper cap 113 is provided on the side of the first end 1112 of the through hole 1111. The trunk 111 is capable of being moved by a robot 40 being attached to it.

A piston unit 13 comprises a shank holder shaft 131, a connecting rod 133, and a pick-up tip 135. The shank holder shaft 131 has a piston portion 1311, an air-suspended portion 1313, an extension portion 1315, and a first air passage 1317 going through it. Being able to fit in the through hole 1111, the piston portion 1311 of the shank holder shaft 131 is capable of moving along the axis of the through hole 1111. Being larger than the through hole 1111, the air-suspended portion 1313 is contained in a hollow space. Having an inner diameter equal to the outer diameter of the air-suspended portion 1313, the hollow ring 115 is provided for forming a sealed first air chamber 1116 between the air-suspended portion 1313 and the trunk 11. The extension portion 1315 extends outside of the lower cap 117. A gap 1319 is provided between the lower cap 117 and the extension portion 1315. One end of the connecting rod 133 is connected with the extension portion 1315. Extending outside the lower cap 117, the other end of the connecting rod 133 is connected with the pick-up tip 135. Preferably, the pick-up tip 135 is made of such softer material as rubber to prevent contact damage to the die (not shown). The connecting rod 133 also provides a second air passage 1318 for connecting with the through hole 1111. In corresponding locations of the trunk 111, the air-suspended portion 1313 and the lower cap 117, a pinhole is provided. By plugging a pin 119 into the pinhole, the air-suspended portion 1313 is restricted to linear rather than rotational movements.

As shown in FIG. 3, the pressure unit 15 comprises at least a vacuum device 151, a pressure source 152, a first pneumatic regulator 153, a second pneumatic regulator 154, a first solenoid valve 155, a second solenoid valve 156, and a control unit 157. The control unit 157 is connected with the aforementioned valves for control purpose. The vacuum device 151 is connected with the first fitting 1114 so as to generate a low-pressure state in the first end 1112 of the through hole 1111, the first air passage 1317 and the second air passage 1318, respectively. By maintaining a low-pressure state in the first air passage 1317 and the second air passage 1318, respectively, the die sorter is capable of picking up dies. Connected between the second fitting 1115 and the pressure source 152, the first pneumatic regulator 153 is capable of regulating the pressure sealed in the first air chamber 1116, balancing the pressures on the top and on the bottom of the air-suspended portion 1313, and rendering the shank holder shaft 131 in an air-suspended state.

The first solenoid valve 155 is provided between the vacuum device 151 and the first fitting 1114. One end of the second solenoid valve 156 is connected with the first solenoid valve 155. By controlling the first solenoid valve 155 and the second solenoid valve 156 to switch between having air flow and otherwise, the second pneumatic regulator 154 between the second solenoid valve 156 and the pressure source 152, is capable of storing a certain amount of air between the first solenoid valve 155 and the second solenoid valve 156. By regulating the first solenoid valve 155, the first fitting 1114 is able to switch between connection with the vacuum device 151 and connection with the second solenoid valve 156. When the first fitting 1114 is having air contact with the vacuum device 151, the low-pressure states in the first air passage 1317 and the second air passage 1318 enable the operation of die pick-up. When the first fitting 1114 connects with the second solenoid valve 156, the air stored between the first solenoid valve 155 and the second solenoid valve 156 is allowed to enter the first air passage 1317 and the second air passage 1318, thus terminating the vacuum state and releasing the die.

An optical sensor 51 and a plurality of sensing components 52 and 53 may be provided on the trunk 111 at proper locations. Disposed on the upper cap 113, the optical sensor 51 possesses a sensing light path (not shown), which passes the through hole 1111, the first air passages 1317 and the second air passage 1318. The optical sensor 51 allows the detection of a die being picked up by the pick-up tip 135, which is situated at the end of the second air passage 1318. The sensing components 52 and 53 are capable of sensing the location of the air-suspended die sorter, respectively.

Figure 4:
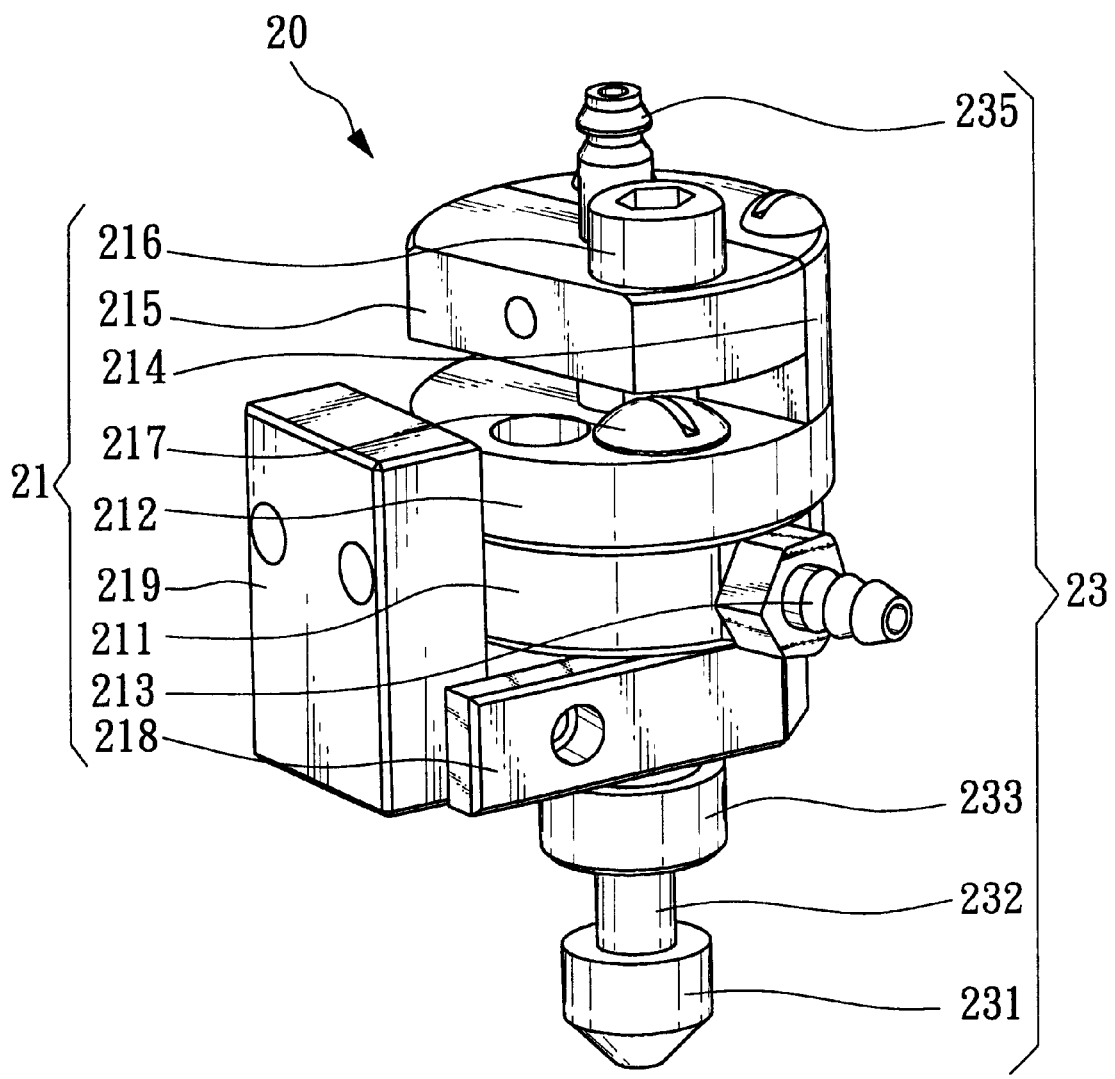
FIG. 4 is a three-dimensional view of an air-suspended die sorter in accordance with the second preferred embodiment of the present invention.
Figure 5:
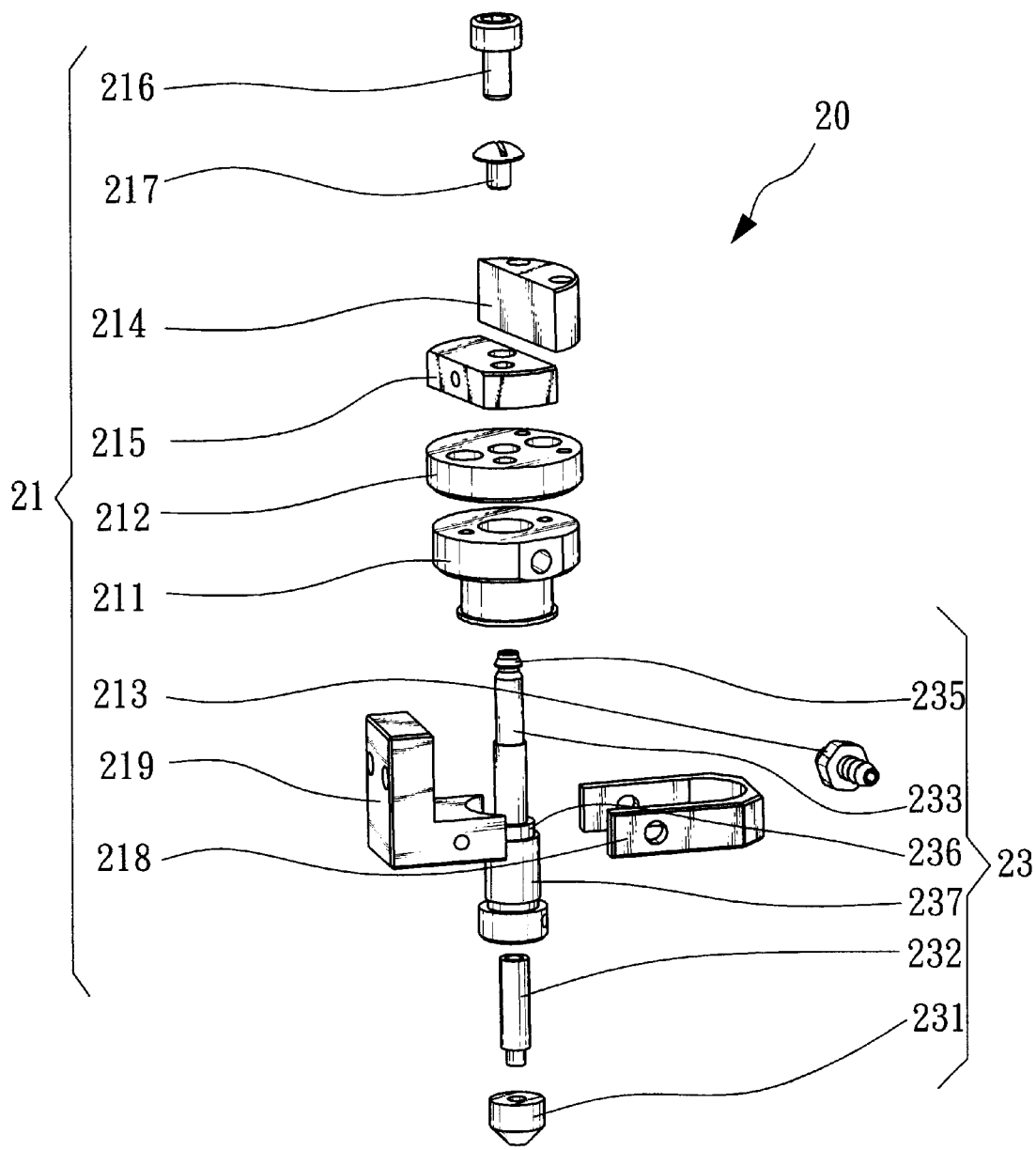
FIG. 5 is an explosive view of an air-suspended die sorter in accordance with the second preferred embodiment of the present invention.

Please refer to FIG. 4 and FIG. 5, which provide a three-dimensional and an explosive view, respectively, of an air-suspended die sorter 20 in accordance with the second preferred embodiment of the present invention. The air-suspended die sorter 20 comprises at least two parts, the first part being a cylinder unit 21 and the second part a piston unit 23. The cylinder unit 21 has a cylinder base 211, a connecting base 212 being connected with the cylinder base 211 for forming a sealed chamber (not shown), a pneumatic fitting 213 for providing a pressure greater than one atmospheric pressure as the operating pressure of the air-suspended die sorter 20 in accordance with the second preferred embodiment of the present invention, a rotation stop block 215 being provided above and at a distance away from the connecting base 212, a second connect screw 216 being secured to the top of the rotation stop block 215 such that its screw head and screw protrude above and below the rotation stop block 215, respectively, a first connect screw 217 being below the second connect screw 216, sharing the same axis with the second connect screw 216 and being secured vertically to the connecting base 212 such that its screw head protrudes above the connecting base 212 and its screw is fully recessed in the connecting base 212, a rotation stopper 214 being secured to the top of the connecting base 212 and being in friction contact with the rotation stop block 215 for preventing the air-suspended die sorter 20 from rotating, a supporter 218 having a smaller diameter and being below the cylinder base 211 for securing the cylinder base 211, and a support base 219 for securing the supporter 218.

Being the second part of the air-suspended die sorter 20, the piston unit 23 comprises a pick-up tip 231 for picking up a die, a pick-up head 232 being provided above the pick-up tip 231, a piston 233 being provided above the pick-up head 232, going vertically in ascending order through the cylinder base 211, the sealed chamber between the cylinder base 211 and the connecting base 212, the connecting base 212, the space between the connecting base 212 and the rotation stop block 215, before protruding above the rotation stop block 215. Having a first rim 236 and a second rim 237 that surround it at proper locations, respectively, the piston 233 is a cylinder having the above-mentioned air passage. Via the first rim 236 and the second rim 237, the piston 233 interacts with the sealed chamber and the lower rim of the rotation stop block 215, respectively. The piston unit 23 further comprises a first fitting 235, an air passage (not shown) going vertically through the pick-up tip 231, the pick-up head 232 and the piston 233. In operation, air is introduced via the pneumatic fitting 213 and air pressure is precisely regulated for driving the piston 233, the pick-up head 232 and the pick-up tip 231 of the air-suspended die sorter for picking up a die.

Figure 6:
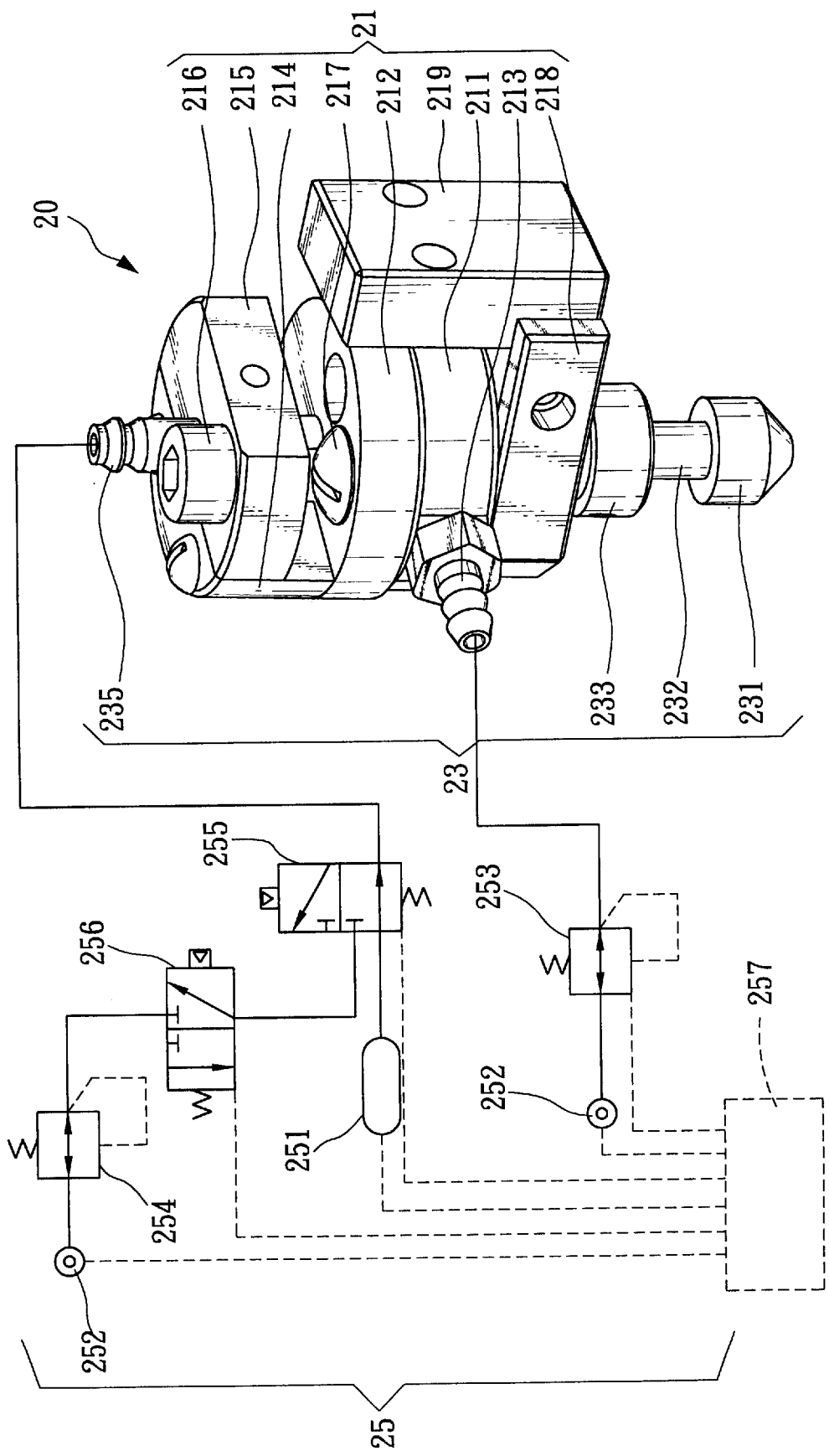
FIG. 6 is a three-dimensional view of an air-suspended die sorter in accordance with the second preferred embodiment of the present invention being connected with a pressure unit.

Please refer to FIG. 6, which shows a three-dimensional view of an air-suspended die sorter in accordance with the second preferred embodiment of the present invention being connected with a pressure unit 25. The pressure unit 25 includes at least a vacuum device 251, a pressure source 252, a first pneumatic regulator 253, a second pneumatic regulator 254, a first solenoid valve 255, a second solenoid valve 256 and a control unit 257. The control unit 257 is connected with the aforementioned valves for control purpose. The vacuum device 251 via a first fitting 235 is capable of generating a low-pressure state in the air passage (not shown) that goes through the pick-up tip 231, the pick-up head 232 and the piston 233, respectively, and enabling the pick-up operation of the pick-up tip 231. Connected between the pneumatic fitting 213 and the pressure source 252, the first pneumatic regulator 253 is capable of regulating the pressure inside the sealed chamber (not shown) between the cylinder base 211 and the connecting base 212 and rendering the piston unit 23 of in an air-suspended state.

The first solenoid valve 255 is connected between the vacuum device 251 and the first fitting 235. One end of the second solenoid valve 256 is connected with the first solenoid valve 255. The second pneumatic regulator 254 is connected between the second solenoid valve 256 and the pressure source 252. By properly controlling the first solenoid valve 255 and the second solenoid valve 256 to switch between having air flow and otherwise, the pressure source 252 provides a certain amount of air between the first solenoid valve 255 and the second solenoid valve 256. The first solenoid valve 255 allows the first fitting 235 to be in air contact with the vacuum device 251 and the second solenoid valve 256, alternatively. When the first fitting 235 is having air contact with the vacuum device 251, the air passage (not shown) that goes through the pick-up tip 231, the pick-up head 232 and the piston 233, respectively, is in a low-pressure state (or vacuum state) for allowing a die to be picked up. When the first fitting 235 is in air contact with the second solenoid valve 256, said certain amount of air between the first solenoid valve 255 and the second solenoid valve 256 is permitted to enter the air passage (not shown) and terminate the vacuum condition, thereby allowing a die to be released.

In operation, air is introduced from the pressure unit 25 and air pressure is precisely regulated for driving downward the piston 233, the pick-up head 232 and the pick-up tip 231 so as to generate an air-suspended state for the air-suspended die sorter 20. When the piston 233 moves downward, the rotation stop block 215 and the second connect screw 216 are caused to move downward until the second connect screw 216 makes contact with the first connect screw 217. The sealed chamber maintains an internal pressure.

Figure 7:
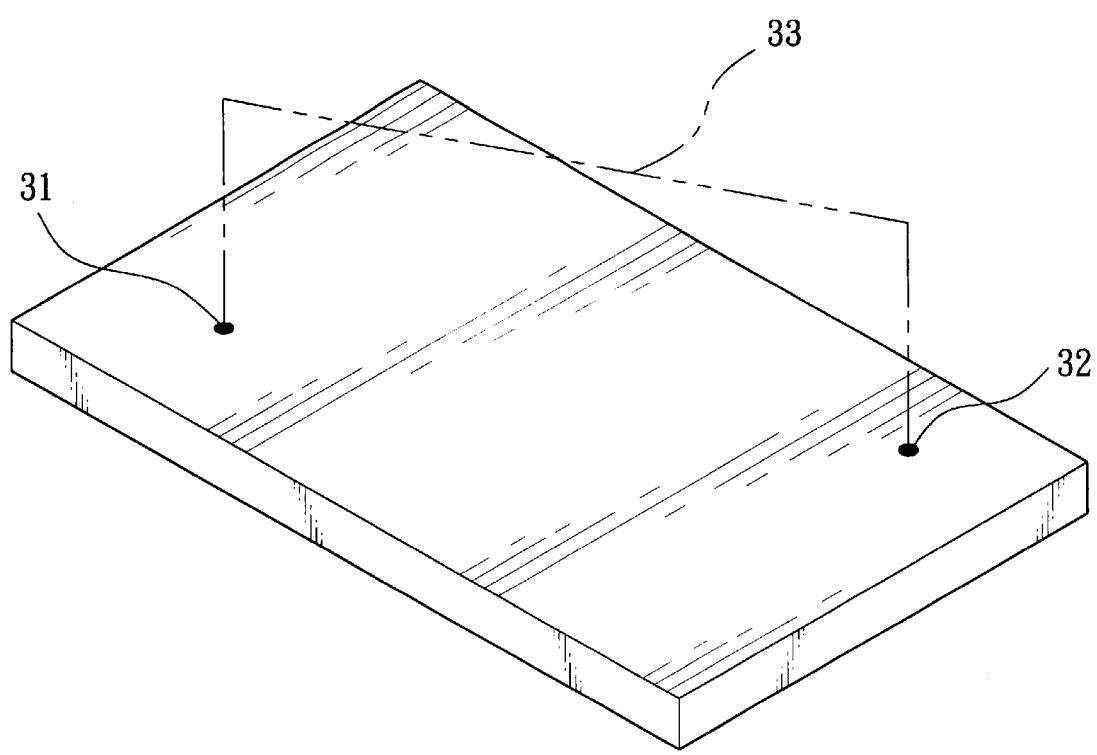
FIG. 7 is a three-dimensional perspective of a route between two operating positions of an air-suspended die sorter in accordance with the second preferred embodiment of the present invention.

Please refer to FIG. 7, which shows a three-dimensional perspective of a route 33 between two operating positions (position A 31 and position B 32) of an air-suspended die sorter 20 in accordance with the second preferred embodiment of the present invention. First, control software directs the air-suspended die sorter 20 to a pre-determined position A 31 for die pick-up. When nearing the area above position A 31, the air-suspended die sorter 20 descends toward position A 31. The moment the pick-up tip 231 touches the die at position A 31, a reactive force causes the pick-up tip 231, the pick-up head 232 and the piston 233 to move upward and the pick-up tip 231, the pick-up head 232 and the piston 233 in turn drive the rotation stop block 215 and the second connect screw 216 to move upward and cause the second connect screw 216 and the first connect screw 217 to separate.

Meanwhile, a sensing unit detects the separation of the second connect screw 216 and the first connect screw 217, which signals the contact between the pick-up tip 231 and the die at position A 31, and sends two instructions accordingly. The first instruction is to stop the air-suspended die sorter 20's downward movement and the second instruction is to activate the pressure unit 25 and cause the air passage (not shown) that goes through the pick-up tip 231, the pick-up head 232 and the piston 233, respectively, to be in a low-pressure state (or vacuum state) for allowing the pick-up tip 231 to pick up a die.

When the pick-up tip 231 holds to a die, air-suspended die sorter 20 moves upward and the reactive upward pressure is released, the piston 233 drives the second connect screw 216 downward and causes the second connect screw 216 to be in contact with the first connect screw 217, again. Driven by control software, the air-suspended die sorter 20, which holds to a die, moves upward from position A 31 to a pre-determined height and moves horizontally to a location above position B 32 before descending to position B 32.

When the pick-up tip 231 descends toward position B, the second connect screw 216 maintains contact with the first connect screw 217 and the sealed chamber (not shown) between the cylinder base 211 and the connecting base 212 also maintains the calibrated pressure. The moment the pick-up tip 231 touches the tray or the platform at position B 32, a reactive force causes the piston 233 to move upward and the piston 233 in turn drives the rotation stop block 215 and the second connect screw 216 to move along and cause the second connect screw 216 and the first connect screw 217 to separate. Meanwhile, a sensing unit detects the contact between the pick-up tip 231 and the tray or the platform at position B 32, and sends two instructions accordingly. The first instruction is to stop the air-suspended die sorter 20's downward movement and the second instruction is to cause the first fitting 235 to be in air contact with the second solenoid valve 256 and allow said certain amount of air stored between the first solenoid valve 255 and the second solenoid valve 256 to enter the air passage (not shown) and terminate the vacuum condition, thereby allowing a die to be released.

In light of the foregoing, the air-suspended die sorter 20 in accordance with the second preferred embodiment of the present invention is capable of moving between two operating positions 31 and 32 and achieving the purpose of picking up and releasing a die. By precisely controlling the pressure above and below the piston 233, the present invention offers an air-suspended state for doing away with stress problems associated with using springs. The present invention further provides a novel buffer design for reducing friction and die impact often encountered in prior art applications.

While the invention has been described in terms of a preferred embodiment, various alternatives and modifications can be devised by those skilled in the art without departing from the invention. Accordingly, the present invention is intended to embrace all such alternatives that fall within the scope of the claims.

What is claimed is:

1. An air-suspended die sorter, comprising:
   a trunk having a through hole having a first end and second ends;
   a first fitting connected with the trunk and capable of having air contact with the through hole;
   a shank holder shaft having a piston portion, an air-suspended portion and an air passage going through an axis of the shank holder shaft, the shank holder shaft fitting in the through hole and movable along the axis, the air-suspended portion being provided on a side of the second end of the through hole;
   a lower cap provided on the trunk forming a hollow space between the lower cap and the trunk such that the air-suspended portion of the shaft holder is located in the hollow space and a first air chamber is formed between the air-suspended portion and the trunk;
   a second fitting connected with the trunk and capable of having air contact with the first air chamber;
   a vacuum device connected with the first fitting and providing a low-pressure state at the first end of the through hole and in the air passage for die pick-up operation; and
   a pneumatic regulator, having one end and another end connected with the second fitting and a pressure source, respectively, for regulating a pressure between the air-suspended portion and the trunk and providing an air-suspended state for the air-suspended portion and the shank holder shaft.

2. The air-suspended die sorter according to claim 1, further comprising:
   a first solenoid valve connected between the vacuum device and the first fitting;
   a second solenoid valve connected with the first solenoid valve; and
   a second pneumatic regulator connected between the second solenoid valve and the pressure source;
   wherein by controlling the first solenoid valve and the second solenoid valve to switch between having air flow and not having air flow, the pressure source provides an amount of air between the first solenoid valve and the second solenoid valve and wherein the first solenoid valve allows the first fitting to be in air contact with the vacuum device and the second solenoid valve, alternatively, such that, when the first fitting has air contact with the vacuum device, the air passage is in a low-pressure state for allowing a die to be picked-up and, when the first fitting is in air contact with the second solenoid valve, said amount of air between the first solenoid valve and the second solenoid valve is permitted to enter the air passage and raise the pressure therein, thereby allowing a die to be released.

3. The air-suspended die sorter according to claim 2, further comprising a control unit controlling the first solenoid valve, the second solenoid valve, the first pneumatic regulator and the second pneumatic regulator.

4. The air-suspended die sorter according to claim 1, further comprising a shank and a tip wherein the shank has a first end connected with an extension portion below the shank holder shaft and a second end extending outside the lower cap while being connected with the tip, and has an air passage going through its axis.

5. The air-suspended die sorter according to claim 1, further comprising a hollow ring wherein the hollow ring is provided between the lower cap and the trunk such that an inner diameter of the hollow ring is the same as an outer diameter of the air-suspended portion.

6. The air-suspended die sorter according to claim 1, further comprising a pinhole provided axially along the trunk, the air-suspended portion and the lower cap such that, by plugging a pin into the pinhole, the air-suspended portion is restricted to linear rather than rotational movements.

7. The air-suspended die sorter according to claim 1, further comprising an upper cap providing coverage on one of the ends of the through hole.

8. The air-suspended die sorter according to claim 7, further comprising an optical sensor provided on the upper cap and having a sensing light path passing through the through hole and the air passage for detecting if a die is located at the end of the air passage.

9. The air-suspended die sorter according to claim 1, further comprising a robot connected with the trunk.

10. The air-suspended die sorter according to claim 9, further comprising at least one sensing unit for sensing a location of the air-suspended die sorter.

11. An air-suspended die sorter, comprising:
a cylinder unit having at least a trunk and a lower cap wherein the trunk has a through hole with a first end and second end, respectively, the lower cap being provided on the trunk, and forming a hollow space between itself and the trunk, the trunk further including a first fitting and a second fitting, which are connected with the first end of the through hole and the hollow space, respectively;
a piston unit having at least a shank holder shaft wherein the shank holder shaft has a piston portion, an air-suspended portion, an extension portion and an air passage going through an axis of the shank holder shaft, the shank holder fitting in the through hole and movable along the axis, and the air-suspended portion is provided in the hollow space, a first air chamber is formed between the air-suspended portion and the trunk on the second end of the through hole, and the extension portion extends outside the lower cap through a gap provided between the lower cap and the extension portion; and
a pressure unit having at least a vacuum device, a pressure source and a first pneumatic regulator wherein, being connected with the first fitting, the vacuum device provides a low-pressure state at the first end of the through hole and in the air passage for enabling a pick-up operation and wherein, being connected between the second fitting and the pressure source, the pneumatic regulator controls a pressure in the first air chamber and balances the pressure on a top and on a bottom of the air-suspended portion, thereby providing an air-suspended state for the shank holder shaft.

12. The air-suspended die sorter according to claim 11, further comprising:
a first solenoid valve connected between the vacuum device and the first fitting;
a second solenoid valve having one end connected with the first solenoid valve; and
a second pneumatic regulator connected between the second solenoid valve and the pressure source;
wherein by controlling the first solenoid valve and the second solenoid valve to switch between having air flow and not having air flow, the pressure source provides an amount of air between the first solenoid valve and the second solenoid valve and wherein the first solenoid valve allows the first fitting to be in air contact with the vacuum device and the second solenoid valve, alternatively, such that, when the first fitting has air contact with the vacuum device, the air passage is in a low-pressure state for allowing a die to be picked-up and, when the first fitting is in air contact with the second solenoid valve, said amount of air between the first solenoid valve and the second solenoid valve is permitted to enter the air passage and raise the pressure therein, thereby allowing a die to be released.

13. The air-suspended die sorter according to claim 11, further comprising a control unit for controlling the pressure unit.

14. The air-suspended die sorter according to claim 11, wherein the piston unit further comprises a shank and a tip such that the shank has one end connected with an extension portion below the shank holder shaft and another end extended outside the lower cap while being connected with the tip, and has an air passage going through an axis.

15. The air-suspended die sorter according to claim 11, wherein the cylinder unit further comprises a hollow ring provided in the hollow space between the lower cap and the trunk, an inner diameter of the hollow ring being the same as an outer diameter of the air-suspended portion.

16. The air-suspended die sorter according to claim 11, further comprising a pinhole provided axially along the trunk, the air-suspended portion and the lower cap such that, by plugging a pin into the pinhole, the air-suspended portion is restricted to linear rather than rotational movements.

17. The air-suspended die sorter according to claim 11, further comprising an upper cap providing coverage on one of the ends of the through hole.

18. The air-suspended die sorter according to claim 17, further comprising an optical sensor provided on the upper cap and having a sensing light path passing through the through hole and the air passage for detecting if a die is located at the end of the air passage.

19. The air-suspended die sorter according to claim 11, further comprising a robot connected with the trunk.

20. The air-suspended die sorter according to claim 19, further comprising at least one sensing unit for sensing a location of the air-suspended die sorter.

21. An air-suspended die sorter, comprising:
a trunk having a through hole and a sealed chamber, which is in air contact with a pressure source via an opening; and
a shank holder shaft having a piston portion and an air passage through an axis of the shank holder shaft such that the shank holder shaft, having a first end in air contact with a vacuum unit and a second end in air contact with outside, fits in the through hole and is movable along the axis of the shank holder shaft such that a first rim, and a second rim are provided on the shank holder shaft, respectively;
wherein, by connecting the first end of the air passage with the vacuum unit and providing a low-pressure state, the shank holder shaft picks up a die at the second end of the air pressure and, the pressure source provides an air-suspended state for the sealed chamber and the shank holder shaft.

22. The air-suspended die sorter according to claim 21, further comprising a pick-up tip and a pick-up head attached to the shank holder shaft.

23. The air-suspended die sorter according to claim 21, further comprising a cylinder base and a connecting base attached to each other and to the trunk, such that a sealed chamber is provided between the cylinder base and the connecting base.

24. The air-suspended die sorter according to claim 23, further comprising a rotation stopper provided above and space from the connecting base, and surrounding the piston portion such that a lower rim of the rotation stopper interacts with the second rim of the shank holder shaft.

25. The air-suspended die sorter according to claim 24, further comprising a first connect screw and a second connect screw, wherein the second connect screw, having a screw head extending above the rotation stopper and a screw portion protruding below the rotation stopper, is secured vertically on the rotation stopper and the first connect screw is provided above the connecting base and on a same axis as the second connect screw, is secured vertically to the connecting base such that a screw head extends above the connecting base and a screw portion is secured inside the connecting base.

26. The air-suspended die sorter according to claim 23, further comprising a rotation stopper provided above the connecting base, for preventing the air-suspended die sorter from rotating.

* * * * *